(12) United States Patent
Chen et al.

(10) Patent No.: US 11,414,757 B2
(45) Date of Patent: Aug. 16, 2022

(54) GAS TUBE, GAS SUPPLY SYSTEM AND MANUFACTURING METHOD OF SEMICONDUCTOR DEVICE USING THE SAME

(71) Applicant: Taiwan Semiconductor Manufacturing Co., Ltd., Hsinchu (TW)

(72) Inventors: Yi-Shiung Chen, Taoyuan (TW); Cheng-Yi Huang, Hsinchu (TW); Chih-Shen Yang, Yunlin County (TW); Shou-Wen Kuo, Hsinchu (TW); Po-Wen Chai, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 229 days.

(21) Appl. No.: 16/172,835

(22) Filed: Oct. 28, 2018

(65) Prior Publication Data

US 2019/0145003 A1     May 16, 2019

Related U.S. Application Data

(60) Provisional application No. 62/584,912, filed on Nov. 13, 2017.

(51) Int. Cl.
*C23C 16/455* (2006.01)
*C23C 16/52* (2006.01)
*H01L 21/67* (2006.01)

(52) U.S. Cl.
CPC ........ *C23C 16/45578* (2013.01); *C23C 16/52* (2013.01); *H01L 21/67057* (2013.01); *H01L 21/67086* (2013.01)

(58) Field of Classification Search
None
See application file for complete search history.

(56) References Cited

U.S. PATENT DOCUMENTS

| | | | | |
|---|---|---|---|---|
| 5,053,132 A * | 10/1991 | Sirkar | ................ | B01D 67/0093 210/500.23 |
| 5,190,102 A * | 3/1993 | Arterbury | .............. | B01D 29/33 166/228 |
| 6,550,499 B1 * | 4/2003 | Pai | .......................... | F16L 11/12 138/104 |
| 7,631,666 B1 * | 12/2009 | Ng | ......................... | F16L 11/081 116/206 |
| 8,372,482 B2 * | 2/2013 | Fry | .................... | C23C 16/45591 427/255.28 |
| 8,701,714 B2 * | 4/2014 | Jansson | .................... | F16L 11/12 138/36 |

(Continued)

*Primary Examiner* — Sylvia MacArthur
(74) *Attorney, Agent, or Firm* — JCIPRNET

(57) ABSTRACT

A gas tube, a gas supply system containing the same and a semiconductor manufacturing method using the same are provided. The gas tube includes a porous material body and a resistant sheath surrounding the porous material body. The porous material body has a hollow tube structure and an empty cavity inside the hollow tube structure. The porous material body is hydrophobic and has a plurality of pores therein. The resistant sheath is disposed on the porous material body and surrounds the porous material body. The resistant sheath includes a plurality of holes penetrating through the resistant sheath.

16 Claims, 6 Drawing Sheets

(56) References Cited

U.S. PATENT DOCUMENTS

| | | | | |
|---|---|---|---|---|
| 2001/0050041 | A1* | 12/2001 | Reardon | H01L 21/6715 118/52 |
| 2004/0045620 | A1* | 3/2004 | Kranbuehl | F16L 9/147 138/143 |
| 2006/0131235 | A1* | 6/2006 | Offeman | B01D 63/103 210/640 |
| 2009/0026282 | A1* | 1/2009 | Bonnet | B32B 27/306 165/56 |
| 2010/0226824 | A1* | 9/2010 | Ophir | B01D 71/34 422/84 |
| 2011/0027408 | A1* | 2/2011 | Suzuki | C23C 14/3407 425/471 |
| 2011/0309051 | A1* | 12/2011 | Choi | H01L 21/6708 216/83 |
| 2019/0145003 | A1* | 5/2019 | Chen | H01L 21/67086 118/715 |

\* cited by examiner

GAS TUBE, GAS SUPPLY SYSTEM AND MANUFACTURING METHOD OF SEMICONDUCTOR DEVICE USING THE SAME

CROSS-REFERENCE TO RELATED APPLICATION

This application claims the priority benefits of U.S. provisional application Ser. No. 62/584,912, filed on Nov. 13, 2017. The entirety of the above-mentioned patent application is hereby incorporated by reference herein and made a part of this specification.

BACKGROUND

Semiconductor manufacturing processes quite often employ immersion or chemical bath for cleaning, wet etching or even stripping operations. Gas supply element or apparatus for supplying gas or air into the immersion bath or chemical bath plays an important role and often has significant impact on the processing results.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
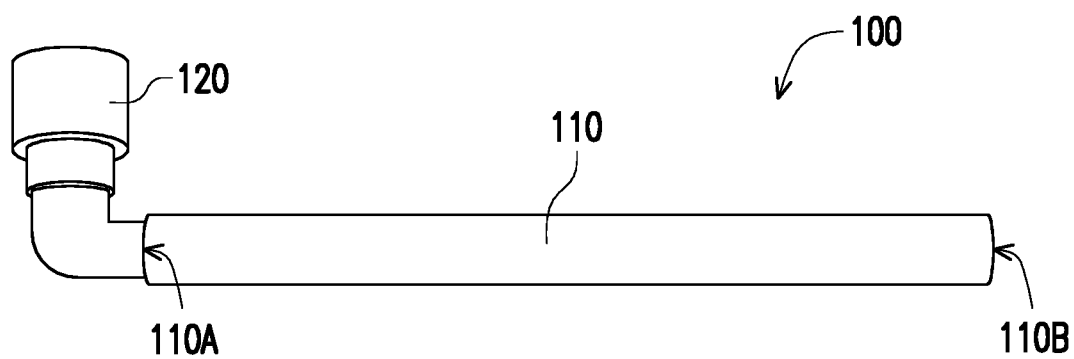
FIG. 1 is a schematic three-dimensional view illustrating a portion of the gas supply element according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2A:
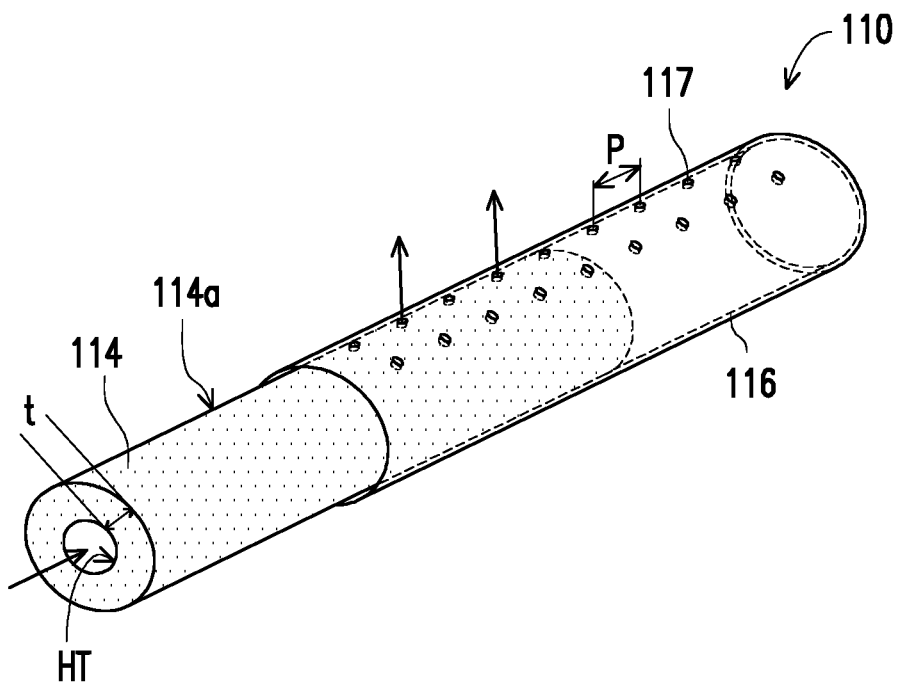
FIG. 2A is a schematic explosive view illustrating a gas supply tube according to some exemplary embodiments of the present disclosure.
Figure 2B:
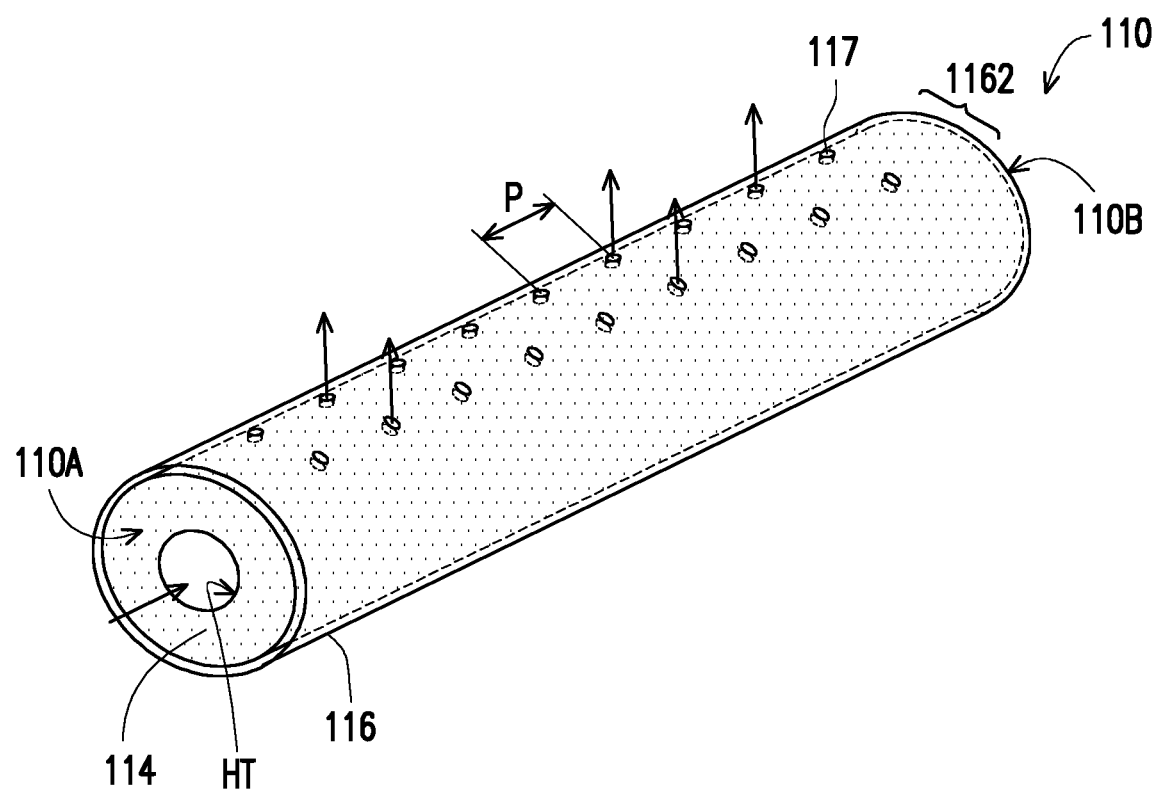
FIG. 2B is a schematic three-dimensional view illustrating a gas supply tube according to some exemplary embodiments of the present disclosure.
Figure 4:
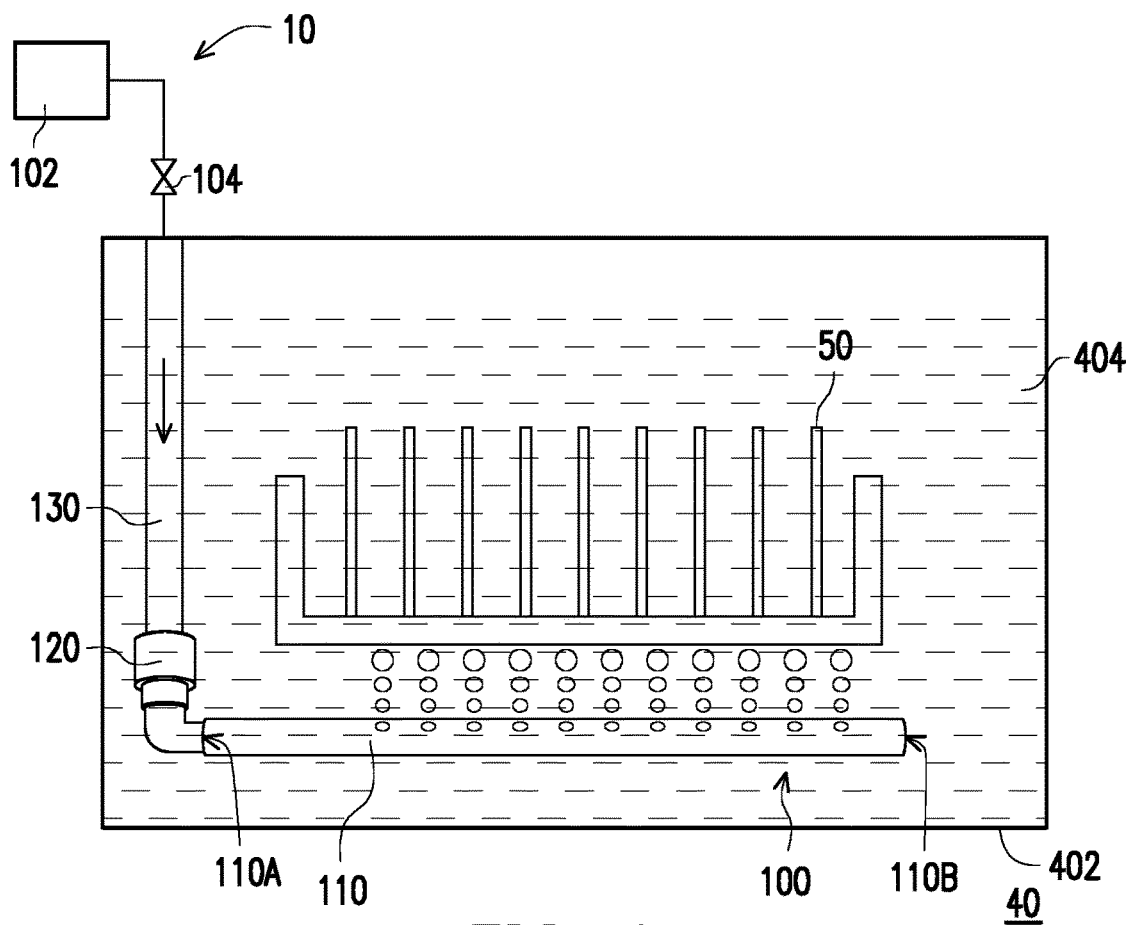
FIG. 4 is a schematic view showing the relative connection relationships of a gas supply system and a semiconductor processing system according to some exemplary embodiments of the present disclosure.

FIG. 1 is a schematic three-dimensional view illustrating a portion of the gas supply element according to some exemplary embodiments of the present disclosure. FIG. 2A is a schematic explosive view illustrating a gas supply tube according to some exemplary embodiments of the present disclosure. FIG. 2B is a schematic three-dimensional view illustrating a gas supply tube according to some exemplary embodiments of the present disclosure. FIG. 4 is a schematic view showing the relative connection relationships of a gas supply system and a semiconductor processing system, showing wafers to be processes in a semiconductor manufacturing process according to some exemplary embodiments of the present disclosure.

Referring to FIG. 1 and FIG. 4, in some embodiments, a gas supply element 100 includes at least a cylindrical gas tube 110 and at least one connector 120 connected to one end 110A of the gas tube 110. In some embodiments, the other end 110B of the gas tube 110 may be a closed end. In other embodiments, the other end 110B of the gas tube 110 may be further connected other gas tubes through one or more connectors. In exemplary embodiments, the gas supply element 100 may be part of a gas supply system 10 for semiconductor manufacturing processes. In some embodiments, the gas supply system 10 further includes an air or gas supply source 102, a valve 104 and one or more pipes 130 connecting between the gas tube 110 and the gas supply source 102. In exemplary embodiments, the gas supply tube 102 includes a gas bottle, a gas tank or an air cylinder. In exemplary embodiments, the valve 104 controls the switch (the on/off) and the flow rate of the gas or air. In certain embodiments, the gas supply system 10 is included as a part of a semiconductor processing system 40, and the semiconductor processing system 40 includes at least an immersion tank 402. In FIG. 4, one or more gas tubes may be arranged within the immersion tank 402 but only one gas tube 110 is shown for simplification, and the gas tube 110 may be provided at one side of the immersion tank 402 or midway of two opposite sides of the immersion tank 402. It is understood that more than one gas tube may be provided at two opposite sides of the immersion tank 402 or even arranged along four sides of the rectangular tank according to the reaction needs or processing requirements. Although only one immersion tank 402 is shown herein, in some embodiments, the semiconductor processing system 40 includes a plurality of immersion tanks. In FIG. 4, the gas supply system 10 arranged within the bath tank 402 of the semiconductor processing system 40 is disposed above and over the to-be-processed wafers according to some exemplary embodiments of the present disclosure. In some embodiments, the immersion tank 402 includes a cleaning tank for performing a wafer cleaning process or for surface preparation. In some embodiments, the cleaning tank includes deionized water or a cleaning solution. In some embodiments, the immersion tank 402 includes a chemical bath tank for wet etching processes. In some embodiments, the chemical bath tank includes an etching solution or a chemical solution including an acid, an organic and/or a base. As shown in FIG. 4, in certain embodiments, the wafers 50 are immersed within the water or solution 404 in the immersion tank 402. It is appreciated that the ingredients or types of the solution 404 may be adjusted or selected depending on the desirable processing conditions of the semiconductor manufacturing process for the wafer or package to be processed. In some embodiments, the gas tube 110 is connected to the gas pipe 130 through the connector 120, and the pipe 130 is further connected with the valve 104 and the gas supply source 102. In some embodiments, the connector 120 may be selected from tee connectors, elbow connectors, cross connectors or connectors of any suitable shapes. In exemplary embodiments, in FIG. 4, the connector 120 is connected to the end 110A of the gas tube 110, while the other end 110B of the gas tube 110 is a closed end. In certain embodiments, the connector 120 may be fastened or threaded with the gas tube 110. In some embodiments, the gas tube 110 and the connector 120 may be connected through tight fitting mechanism, such as compression fitting, flare fitting, flange fitting or the like.

Figure 3:
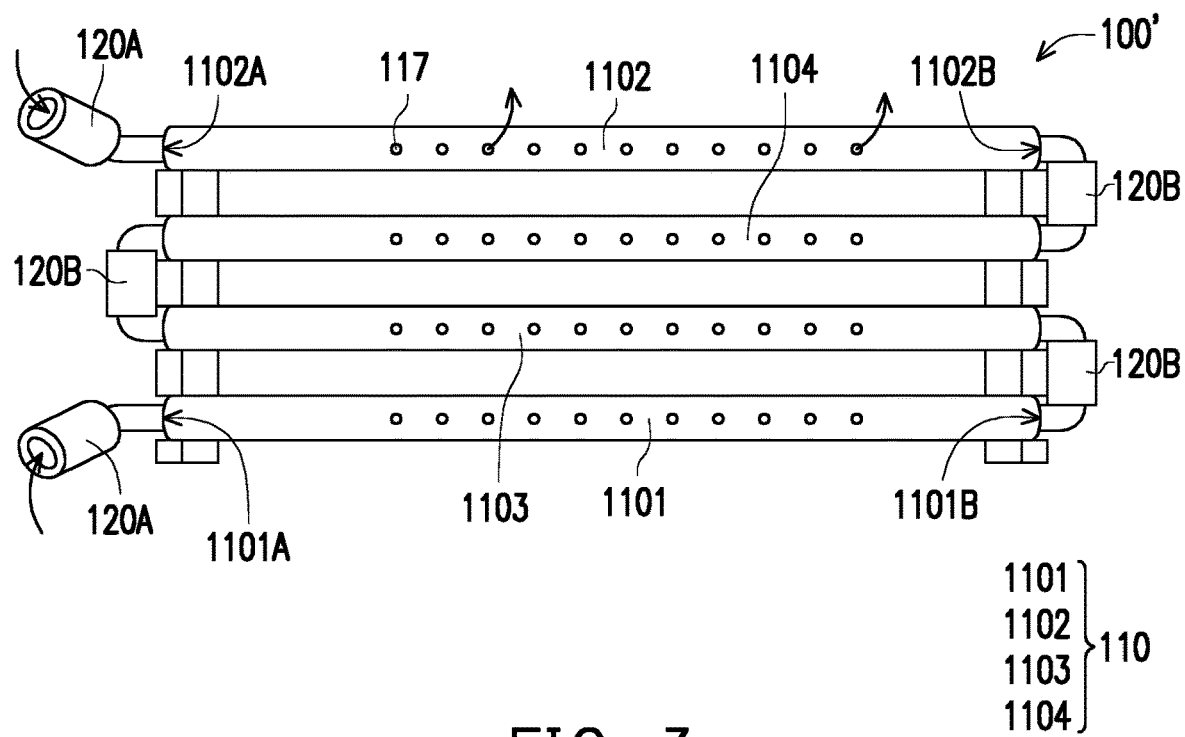
FIG. 3 is a schematic view illustrating a portion of the gas supply element according to some exemplary embodiments of the present disclosure.

FIG. 3 is a schematic view illustrating a portion of the gas supply element according to some exemplary embodiments of the present disclosure. Referring to FIG. 3, in some embodiments, the gas supply element 100' includes a plurality of gas tubes 110 (including four gas tubes 1101-1104 shown in FIG. 3) and connectors 120 respectively connected to two opposite ends 110A, 110B of the gas tubes 110. In some embodiments, in FIG. 3, the ends 1101A, 1102A of the gas tubes 1101, 1102 are connected with connectors 120A, and are further connected with the gas supply source. In exemplary embodiments, the other ends 1101B, 1102B (opposite ends relative to the gas entering ends 1101A, 1102A) of the gas tubes 1101, 1102 are respectively connected with the other gas tubes 1103, 1104 through connectors 120B, and the other gas tubes 1103, 1104 are connected to each other through the connectors 120B. In some embodiments, the gas tubes 1101, 1102, 1103, 1104 (gas tubes 110) are serially connected and interconnected with the adjacent ones. In certain embodiments, the gas enters into the gas tubes 110 from the connectors 120A and flows out off from the gas tubes 110 into the surrounding environment (e.g. the tank) through the holes (the arrows showing the flow direction of the gas). In some embodiments, the connectors 120A, 120B may be tee connectors, elbow connectors, cross connectors or connectors of any suitable shapes. In some embodiments, the connectors 120A, 120B are different types of connectors. In certain embodiments, the connectors 120A, 120B may be fastened or threaded with the gas tubes 110. In some embodiments, the gas tubes 110 and the connectors 120A, 120B may be connected through tight fitting mechanism, such as compression fitting, flare fitting, flange fitting or the like.

In some embodiments, in FIG. 1 to FIG. 2B, the gas tube 110 further includes a porous material body 114 and a resistant sheath 116 covering the porous material body 114. In some embodiments, the porous material body 114 has a cylindrical hollow tube structure having an empty cavity HT located on the inside. In some embodiments, the tube-shaped structure of the porous material body 114 is rigid enough to maintain its shape and the porous material body 114 itself functions as a supportive bulk for sustaining the gas pressure and supporting the resistant sheath 116. In some embodiments, the resistant sheath 116 has a cylindrical hollow tube structure having an empty cavity HT extending along a longitudinal direction of the hollow tube structure. In some embodiments, the resistant sheath 116 is located on the outer surface 114a of the porous material body 114 and directly contacts the porous material body 114, and surrounds the tube-shaped structure of the porous material body 114. In some embodiments, the porous material body 114 is at least tightly fitted within the resistant sheath 116. In certain embodiments, the porous material body 114 and the resistant sheath 116 surrounding the porous material body 114 are arranged concentrically. In some embodiments, the resistant sheath 116 is jointed or attached with the porous material body 114. In certain embodiments, the resistant sheath 116 is a cylindrical shell or sleeve and the tube-shaped structure of the resistant sheath 116 fully covers the outer surface 114a of the porous material body 114. In some embodiments, the hollow cavity HT located in the midst of the porous material body 114 has a diameter ranging from 3~10 millimeters.

In alternative embodiments, a support tube having a cylindrical hollow tube structure may be further included within the cavity of the hollow porous material body 114. In some embodiments, the support tube may have more than one open slits on its tube wall for the gas penetrating through the tube wall in the thickness direction of the tube.

In some embodiments, the porous material body 114 is made of a highly porous material and has a plurality of pores that are so tiny and naked eye invisible. In certain embodiments, the tiny pores has a size ranging from 0.1-3 microns, the porosity (referring to the percent open area) of the tiny pores in the porous material is at least 50% or ranging from 50% to 75%. That is, the pores (in total) takes at least 50% v/v or about 50~75% v/v of the total volume of the porous material, while the non-pore proportion of the porous material takes about 25~50% v/v of the total volume of the porous material. In some embodiments, the porous material of the porous material body 114 is inert to most aggressive solvents, including strong acids and bases. That is, the porous material body 114 includes at least one material resistant to the acidic pH environment and/or alkaline pH environment (i.e. acid and base resistant material). In certain embodiments, the material of the porous material body 114 is hydrophobic. In certain embodiments, depending on the hydrophobicity of the porous material, the pore size of the porous material body 114 is chosen to be small enough to prevent liquid or chemicals from entering into the body or tube. In some embodiments, because of the hydrophobic porous material body 114, water or liquids are kept from entering into the cavity to prevent the gas tube from being clogged with water or liquid. In some embodiments, owing to the hydrophobicity of the porous material body 114, the gas tube is not clogged as the liquid or water will not flow into the tube, and the gas or air passing through the porous material body 114 evenly goes through the porous material body 114 and is released through the resistant sheath 116. For example, the pore size of the porous material body 114 may be adjusted along with the thickness of the porous material body 114 for controlling the air or gas flow rate. In some embodiments, uniform gas distribution and continuous and unceasing gas flow may be achieved by appropriately choosing the pore size of the porous material body 114 along with the thickness of the porous material body 114. In certain embodiments, the material of the porous material body 114 is high temperature stable, such as stable at the temperatures over 120 degrees Celsius, over 150 degrees Celsius, or stable at the temperatures of 100~250 degrees Celsius. In certain embodiments, the material of the porous material body 114 includes polytetrafluoroethylene (PTFE). PTFE is a high heat resistance hydrophobic fluoropolymer of tetrafluoroethylene. For a hydrophobic material or a hydrophobic surface of a material or an object, the water contact angle is in general larger than 90°. In some embodiments, in FIG. 2A, the porous material body 114 has a thickness t, and the thickness t may be adjusted based on the flow rate of the air or gas. In one embodiment, the thickness t of the porous material body 114 ranges from about 3-8 millimeters.

In some embodiments, as shown in FIG. 2A and FIG. 2B, the resistant sheath 116 includes a plurality of holes 117 penetrating through the resistant sheath 116 (i.e. extending from the inner surface to the outer surface of the sheath 116). In some embodiments, the holes 117 are open holes (penetrating through the sheath along the thickness direction) and are substantially round shaped or elliptical holes having a hole size (i.e. maximum diameter) of about 0.8~1.0 millimeters. In certain embodiments, the holes 117 are individual holes arranged side by side and are arranged with a pitch p (i.e. separated by a distance) between one another, and the pitch p ranges from about 1-50 millimeters. In some embodiments, the holes 117 are separate from one another and are arranged next to each other with the uniform pitch p as shown in FIG. 2A & FIG. 2B. In accordance with the embodiments, the pitch p can be modified based on product design or the number of the holes 117. In alternative embodiments, holes of different sizes may be arranged with different pitches. In certain embodiments, the holes 117 may be arranged as one row, two rows or more rows extending along the longitudinal direction of the tube structure of the resistant sheath 116. Depending on the setup of the gas supply system, the holes 117 are disposed on the top portion or the upper portion 1162 (the facing up portion) of the resistant sheath 116. In alternative embodiments, the holes 117 are arranged as two rows arranged on two opposite sides of the tubular structure of the resistant sheath 116. In certain embodiments, the resistant sheath 116 protects the porous material body 114 and helps control the direction of the release gas and uniform distribution of the gas. In certain embodiments, by arranging the holes 117 on the top portion or the upper portion 1162 of the resistant sheath 116, the floating effect of the gas tube 110 is alleviated. In some embodiments, the material of the resistant sheath 116 includes at least one material resistant to the acidic pH environment and/or alkaline pH environment (i.e. one acid and base resistant material). In certain embodiments, the material of the resistant sheath 116 may be hydrophobic. In certain embodiments, the material of the resistant sheath 116 is able to endure high temperatures, such as stable at the temperatures over 120 degrees Celsius, over 150 degrees Celsius, or stable at the temperatures of 100~250 degrees Celsius. In certain embodiments, the material of the resistant sheath 116 includes polyvinylidene fluoride (PVDF). PVDF is a highly non-reactive thermoplastic fluoropolymer resistant to most acids and bases. In some embodiments, the resistant sheath 116 has a thickness ranging from about 1-2 millimeters.

In some embodiments, referring to FIG. 4, when the gas or air is supplied from the gas supply source 102, then supplied to the gas pipe(s) 130 through the valve 104. The gas or air is blown into the gas supply element 100 (into the gas tube 110) and then ejected from the holes 117 of the gas tube 110, and then released out into the solution 404 in the tank 402. In certain embodiments, as shown in FIG. 2A and FIG. 2B, the gas or air that is supplied into the inside the space (empty cavity) HT of the porous material body 114 (gas flow direction is shown as the arrow) flows outward through the tiny pores of the porous material body 114, reaches the resistant sheath 116, then further flows through the resistant sheath 116 and is then released through the holes 117 into the outer environment. For example, when the gas tube 110 is immersed in the bath tank, the air or gas may be supplied into the gas tube 110 and flow out of the gas tube 110 as bubbles into the bath. In some embodiments, the flow rate of the outward-flowing released air or gas (i.e. the released bubbles) may be controlled by tuning the number of holes, the hole size of the resistant sheath 116, the pitch p between the holes 117 and the thickness t of the porous material body 114. In some embodiments, the flow direction of the outward flowing air or gas (i.e. the released bubbles) may be controlled by adjusting the number, the size or the arrangement of the holes 117 in the resistant sheath 116. In some embodiments, the flow rate of the release air or gas released from the gas tube 110 may range from about 2.0 liters/minute to about 10.0 liters/minute or from about 3.0 liters/minute to about 8.0 liters/minute. It is understood that the flow rate of the release air or gas may be adjusted based on the processing needs or the reaction conditions for the semiconductor manufacturing processes. As seen in FIG. 4, in some exemplary embodiments, the gas supply element 100 is placed within the immersion tank 402 and located in the lower part of the immersion tank 402, while a batch of the wafers 50 is immersed in the solution 404 within the immersion tank 402 and placed above the gas tube 110. In certain embodiments, the gas or bubbles released from the gas tube 110 moves upward and toward the wafers 50. During the bath, the unvarying and constant concentration of the solution in the immersion tank is critical for uniform reaction or steady removal or cleaning of the residues on the wafers. In some embodiments, by releasing the bubbles into the solution 404, the solution 404 is agitated and well mixed so that the concentration of the solution 404 in the immersion tank is almost constant. By doing so, the wafers 50 immersed in the immersion tank 402 is exposed to the well-mixed solution 404 and is globally processed consistently and evenly.

FIG. 5A to FIG. 5D are schematic cross sectional views of various stages in a manufacturing method of a semiconductor device according to some exemplary embodiments. FIG. 6 is the flow chart showing the process steps of the manufacturing method of a semiconductor device according to some exemplary embodiments. In exemplary embodiments, the semiconductor manufacturing method is part of wafer-level semiconductor manufacturing processes. In exemplary embodiments, the semiconductor manufacturing method is part of semiconductor packaging processes. In some embodiments, one wafer is shown to represent a batch of wafers or plural batches of wafers obtained following the semiconductor manufacturing method.

Figure 5A:
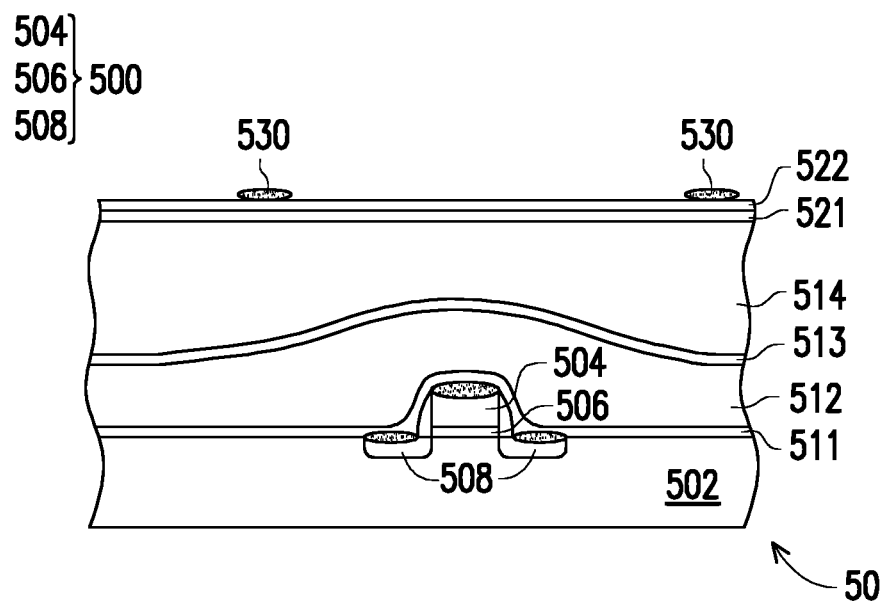
FIG. 5A to FIG. 5D are schematic cross sectional views of various stages in a manufacturing method of a semiconductor device according to some exemplary embodiments.
Figure 6:
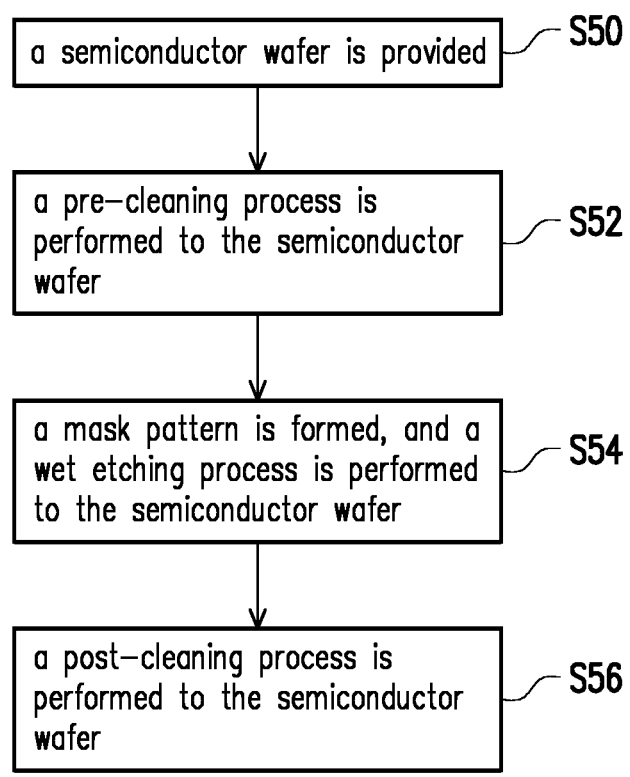
FIG. 6 is the flow chart showing the process steps of the manufacturing method of a semiconductor device according to some exemplary embodiments.

Referring to FIG. 5A, according to some embodiments, in Step S50, a semiconductor wafer 50 is provided. In some embodiments, the semiconductor wafer is a silicon bulk wafer, a silicon on insulator (SOI) wafer or a gallium arsenide wafer. In certain embodiments, the semiconductor wafer 50 has at least one semiconductor device 500 formed in the active area of a silicon substrate 502. In some embodiments, the semiconductor device 500 is, for example, a metal-oxide semiconductor (MOS) transistor comprising a gate electrode 504, a gate dielectric layer 506 under the gate electrode 504, and source/drain regions 508 on both sides of the gate electrode 504. In some embodiments, the semiconductor wafer 50 further includes a plurality of insulating layers 511, 512, 513 and 514 stacked over the semiconductor device 500 and the silicon substrate 502 and dielectric layers 521, 522 formed on the insulating layer 514. In addition, some residues 530 are present on the topmost dielectric layer 522. In some embodiments, the residues 530 includes polymer residues. In some embodiments, the residues 530 includes metallic particles.

Figure 5B:
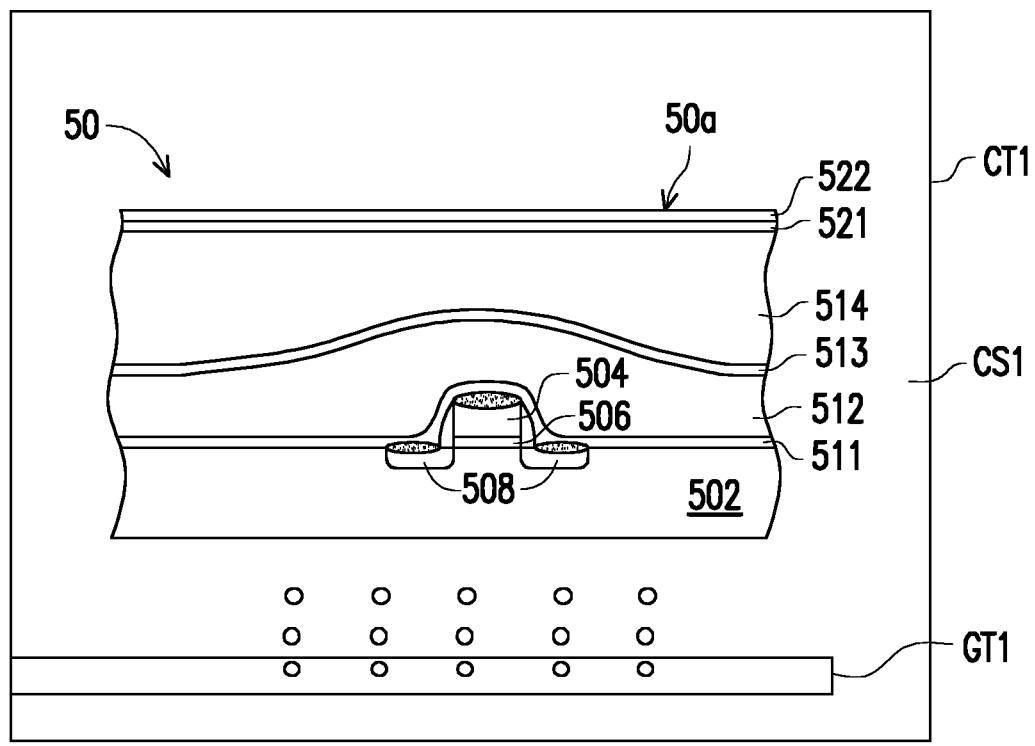

Referring to FIG. 5B, according to some embodiments, in Step S52, a pre-cleaning process is performed to the semiconductor wafer 50. In certain embodiments, the pre-cleaning process includes placing the semiconductor wafer 50 into a cleaning tank CT1 and immersing the semiconductor wafer 50 into the cleaning solution CS1 hold within the cleaning tank CT1. In certain embodiments, the residues 530 are removed during the pre-cleaning process and a clean wafer surface 50a is prepared. In some embodiments, the pre-cleaning process includes supplying a first gas into the cleaning solution CS1, and the cleaning tank CT1 is equipped with a gas tube GT1 to supply the first gas. In some embodiments, the first gas may be a clean dried air, a nitrogen gas or a carbon dioxide gas. In some embodiments, the pre-cleaning process further includes a deionized water rinsing step.

In some embodiments, the pre-cleaning process basically has good selectivity in removing the residues 530 without damaging the underlying layers. In some embodiments, the cleaning solution CS1 may be a mixture of a diluted hydrogen peroxide solution and an acidic solution (such as a sulfuric acid solution or a hydrochloric acid solution. For example, the sulfuric acid solution can be a 96 wt. % $H_2SO_4$ solution and the diluted hydrogen peroxide solution can be a 30-35 wt. % $H_2O_2$ solution. As described herein, the weight percentage of sulfuric acid or hydrogen peroxide in the sulfuric acid solution or diluted hydrogen peroxide solution is merely based on the concentrations of commercially available products used in the industry, but the scope of this disclosure shall not be limited by these descriptions.

Figure 5C:
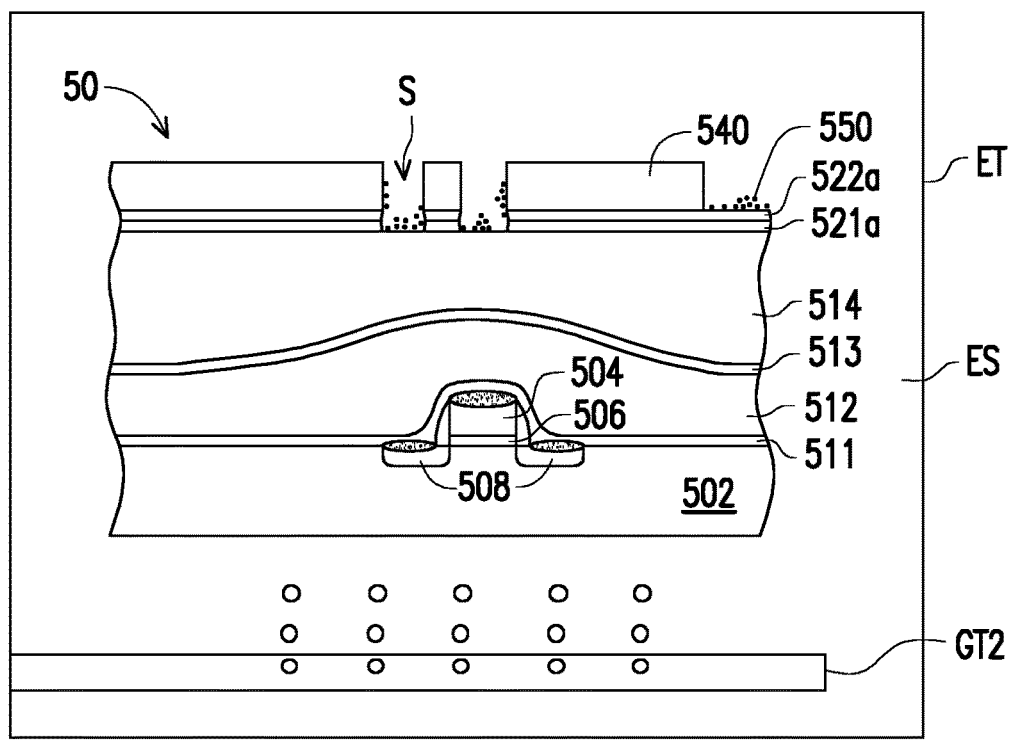

Referring to FIG. 5C, according to some embodiments, in Step S54, a mask pattern 540 is formed on the clean wafer surface 50a, and then a wet etching process is performed to the semiconductor wafer 50 after the formation of the mask pattern 540. In some embodiments, the dielectric layers 521, 522 are etched using the mask pattern 540 as the etching mask. In certain embodiments, the wet etching process includes placing the wafer 50 with the mask pattern 540 into an etching tank ET and immersing the semiconductor wafer 50 into the etching solution ES hold within the etching tank ET. In certain embodiments, the dielectric layers 521, 522 are etched and patterned into the patterned dielectric layers 521a, 522a by the wet etching process and openings S are formed within the patterned dielectric layers 521a, 522a. In some embodiments, the etching process includes optionally supplying a second gas into the etching solution ES, and the etching tank ET is equipped with a gas tube GT2 to supply the second gas. In some embodiments, the second gas may be an inert gas, a clean dried air, a nitrogen gas or a carbon dioxide gas. In alternative embodiments, the etching process does not include supplying a gas or air into the etching solution ES.

In some embodiments, the wet etching process basically has good selectivity in removing the dielectric layers 521, 522 without damaging the underlying insulating layers. In some embodiments, the etching solution ES may be a mixture of a buffering agent and an acidic solution. In some embodiments, the buffering agent solution is a 49 wt. % ammonium fluoride ($NH_4F$) solution, and the acidic solution is a 49 wt. % hydrofluoric acid (HF) solution. Optionally, hydrochloric acid may be included. In some embodiments, the materials of the dielectric layers 521, 522 include silicon dioxide or silicon nitride.

Figure 5D:
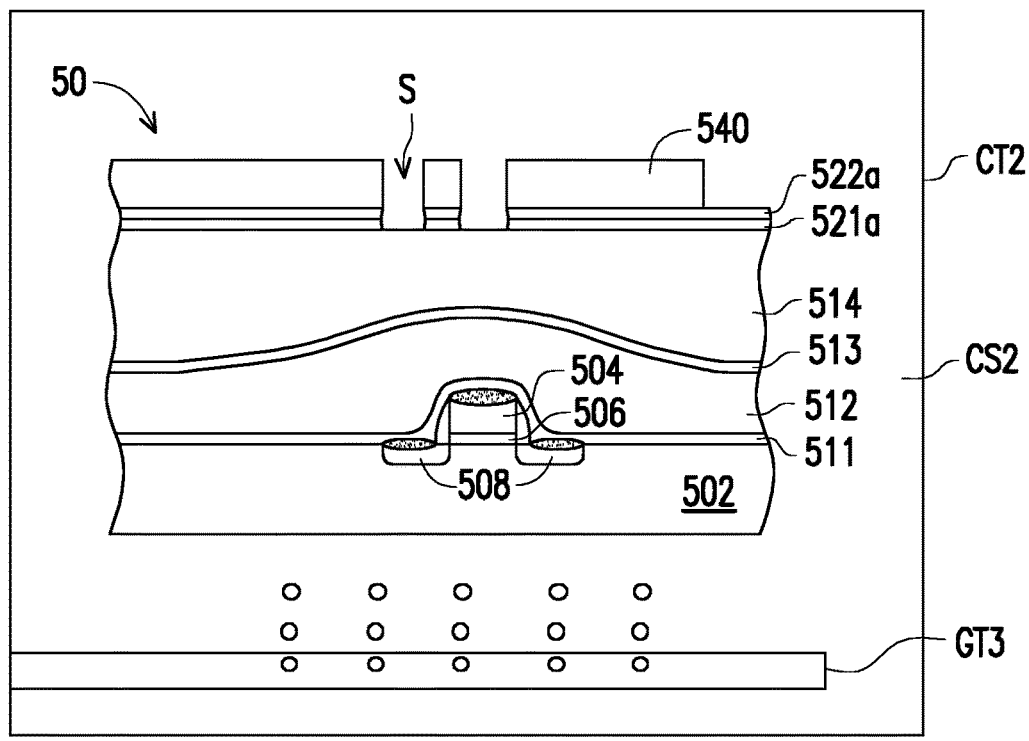

Referring to FIG. 5D, according to some embodiments, in Step S56, a post-cleaning process is performed to the processed semiconductor wafer 50. In certain embodiments, the post-cleaning process includes placing the semiconductor wafer 50 into a cleaning tank CT2 and immersing the semiconductor wafer 50 into the cleaning solution CS2 hold within the cleaning tank CT2. After the etching process, certain residues 550 may be generated and remained on the surface of the patterned dielectric layer 522a or within the openings S. In certain embodiments, the residues 550 includes polymer residues and the residues 550 are removed by the post-cleaning process. In some embodiments, the post-cleaning process includes supplying a third gas into the cleaning solution CS2, and the cleaning tank CT2 is equipped with a gas tube GT3 to supply the third gas. In some embodiments, the third gas may be a clean dried air, a nitrogen gas or a carbon dioxide gas. In some embodiments, the post-cleaning process further includes a deionized water rinsing step.

In some embodiments, the post-cleaning process removes mostly the residues 550. In some embodiments, the cleaning solution CS2 may be a mixture of a diluted hydrogen peroxide solution and an acidic solution, such as a sulfuric acid solution or a hydrochloric acid solution. For example, the sulfuric acid solution can be a 96 wt. % $H_2SO_4$ solution and the diluted hydrogen peroxide solution can be a 30~35 wt. % $H_2O_2$ solution. In alternative embodiments, the cleaning solution may be a solution of deionized water for extra rinsing or cleaning.

In exemplary embodiments, the gas tubes GT1, GT2 and GT3 for the previously described processes may utilize the same gas tube or the gas tube similar to the previously described gas tube 110, for supply the gas uniformly and continuously in a controlled way. It is appreciated that the process steps, the recipes of the cleaning solution(s) or the etching solution(s) or the materials described herein are simply exemplary but are not intended to limit the scope of this disclosure. The previous described semiconductor manufacturing processes are provided for illustration purposes. The gas tube or the gas supply element described in the previous embodiments of this disclosure can be used or applied in front end of line processes or back end of line processes of the semiconductor manufacturing processes.

In some embodiments, the gas tube or the gas supply element may be applicable for a semiconductor manufacturing method for processing any suitable structure including a semiconductor wafer, a die and package structures. For cleaning, etching or processing a wafer or an intermediate wafer-level package structure, air or gas may be supplied through the gas tube or the gas supply element during the processes, leading to uniform gas flow rate and non-clogged and continuous gas supply.

In some embodiments, the gas tube or the gas supply element provides a non-clogging and uniform gas flow and functions as tube(s) to supply gas or air into the de-ionized water, cleaning solution(s), reaction solution(s) or chemical bath(s). Through the application of the gas tube or the gas supply element as described in the above embodiments, better removal of particles and polymeric residues can be achieved. In addition, by using the gas tube or the gas supply element in the reaction tank, consistent and unvarying reactions are offered and the reliability of the obtained products is improved.

According to some embodiments, a gas tube having a porous material body and a resistant sheath is described. The porous material body has a hollow tube structure and an empty cavity inside the hollow tube structure. The porous material body is hydrophobic and has a plurality of pores therein. The resistant sheath is disposed on the porous material body and surrounds the porous material body. The resistant sheath includes a plurality of holes penetrating through the resistant sheath.

According to some embodiments, a gas supply system including a gas supply source, at least one gas tube connected with the gas supply source, a pipe, a valve and connectors is described. The pipe is connected with the gas supply source and connect the gas supply source and the at least one gas tube. The valve is located between the pipe and the gas supply source. The connector(s) is connected to at least one end of the at least one gas tube and connects the pipe with the at least one gas tube. The gas tube has a porous material body and a resistant sheath. The porous material body has a hollow tube structure and an empty cavity inside the hollow tube structure. The porous material body is hydrophobic and has a plurality of pores therein. The resistant sheath is disposed on the porous material body and surrounds the porous material body. The resistant sheath includes a plurality of holes penetrating through the resistant sheath.

According to some embodiments, a semiconductor manufacturing method for a semiconductor device is described. A wafer is provided. A pre-cleaning process is performed to the wafer by immersing the wafer into a first clean solution in a first clean tank and supplying a first gas through a first gas tube. A wet etching process is performed to the wafer by immersing the wafer into an etching solution in an etching tank and supplying a second gas through a second gas tube. A post-cleaning process is performed to the wafer by immersing the wafer into a second clean solution in a second clean tank and supplying a third gas through a third gas tube. At least one of the first gas tube, the second gas tube and the third gas tube is the gas supplying tube as described in the above embodiments.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A gas tube of supplying a gas, comprising:
a porous material body having a hollow tube structure and an empty cavity inside the hollow tube structure, wherein the porous material body is hydrophobic and is made of a porous material with a porosity of at least 50% volume per volume (% v/v) of a total volume of the porous material; and
a resistant sheath, disposed on the porous material body and surrounding the porous material body, wherein the resistant sheath has a cylindrical sleeve structure wrapping around a whole circumference of the hollow tube structure and extending entirely along a longitudinal direction of the hollow tube structure of the porous material body to fully cover an outer surface of the hollow tube structure with no intervening layer disposed therebetween, wherein the resistant sheath is the outermost layer, is hydrophobic and is made of a polymeric material and includes a plurality of holes penetrating through the resistant sheath.

2. The element according to claim 1, wherein the porous material body is tightly fitted within the resistant sheath.

3. The element according to claim 2, wherein the porous material body and the resistant sheath surrounding the porous material body are tightly fitted concentrically, and the resistant sheath contacts an outer surface of the porous material body.

4. The element according to claim 1, wherein the porosity of the porous material is about 50% volume per volume (% v/v) to about 75% v/v of a total volume of the porous material.

5. The element according to claim 4, wherein the porous material includes polytetrafluoroethylene.

6. The element according to claim 1, wherein a material of the resistant sheath includes polyvinylidene fluoride.

7. The element according to claim 1, wherein the plurality of holes includes individual substantially round shaped holes arranged side by side as a row, and the plurality of holes is arranged in an upper portion of the resistant sheath.

8. The element according to claim 1, wherein the porous material body has a plurality of pores with pore sizes ranging from 0.1 microns to about 3 microns, and the plurality of holes of the resistant sheath has a maximaum diameter of about 0.8 millimeters to about 1.0 millimeter.

9. A gas supply system for supplying a gas, comprising:
a gas supply source;
at least one gas tube connected with the gas supply source;
a pipe, connected with the gas supply source and connecting the gas supply source and the at least one gas tube;
a valve, located between the pipe and the gas supply source; and
at least one connector, connected to at least one end of the at least one gas tube and connecting the pipe with the at least one gas tube, and
wherein the at least one gas tube comprises:
a porous material body having a hollow tube structure and an empty cavity inside the hollow tube structure, wherein the porous material body is hydrophobic and is made of a porous material with a porosity of at least 50% volume per volume (% v/v) of a total volume of the porous material; and
a resistant sheath, disposed on the porous material body and surrounding the porous material body, wherein the resistant sheath has a cylindrical sleeve structure wrapping around a whole circumference of the hollow tube structure and extending entirely along a longitudinal direction of the hollow tube structure of the porous material body to fully cover an outer surface of the hollow tube structure with no intervening layer disposed therebetween, wherein the resistant sheath is the outermost layer, is hydrophobic and is made of a polymeric material and includes a plurality of holes penetrating through the resistant sheath.

10. The system according to claim 9, wherein the resistant sheath is in contact with an outer surface of the porous material body.

11. The system according to claim 9, wherein the porous material body is tightly fitted within the resistant sheath, and the porous material body and the resistant sheath are concentrically fitted.

12. The system according to claim 9, wherein the porosity of the porous material is about 50% volume per volume (% v/v) to about 75% v/v of a total volume of the porous material.

13. The system according to claim 12, wherein the porous material includes polytetrafluoroethylene.

14. The system according to claim 9, wherein a material of the resistant sheath includes polyvinylidene fluoride.

15. The system according to claim 9, wherein the plurality of holes includes individual substantially round shaped holes arranged side by side as a row, and the plurality of holes is arranged in an upper portion of the resistant sheath.

16. The system according to claim 9, wherein the porous material body has a plurality of pores with pore sizes ranging from 0.1 microns to about 3 microns, and the plurality of holes of the resistant sheath has a maximaum diameter of about 0.8 millimeters to about 1.0 millimeter.

* * * * *